(12) United States Patent
Glocker

(10) Patent No.: US 6,235,170 B1
(45) Date of Patent: *May 22, 2001

(54) CONICAL SPUTTERING TARGET

(75) Inventor: David A. Glocker, 791 Rush Henrietta Town Line Rd., Rush, NY (US) 14543

(73) Assignee: David A. Glocker, Rush, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/487,041

(22) Filed: Jan. 19, 2000

Related U.S. Application Data (63) Continuation-in-part of application No. 09/095,301, filed on Jun. 10, 1998, now Pat. No. 6,066,242.

(51) Int. Cl.[7] ................................................. C23C 14/34
(52) U.S. Cl. ............................... 204/298.18; 204/298.08; 204/298.12; 204/298.14; 204/298.17; 204/298.19; 204/298.26
(58) Field of Search .................... 204/298.08, 298.12, 204/298.14, 298.17, 298.18, 298.19, 298.26

(56) References Cited

U.S. PATENT DOCUMENTS

| | | | |
|---|---|---|---|
| 3,884,793 | 5/1975 | Penfold et al. | 204/298.16 |
| 3,919,678 | 11/1975 | Penfold | 335/296 |
| 3,995,187 | 11/1976 | Penfold et al. | 313/346 R |
| 4,030,996 | 6/1977 | Penfold et al. | 204/192.12 |
| 4,031,424 | 6/1977 | Penfold et al. | 204/192.12 |
| 4,041,353 | 8/1977 | Penfold et al. | 315/267 |
| 4,111,782 | 9/1978 | Penfold et al. | 204/298.21 |
| 4,116,793 | 9/1978 | Penfold et al. | 204/192.12 |
| 4,116,794 | 9/1978 | Penfold et al. | 204/192.12 |
| 4,132,612 | 1/1979 | Penfold et al. | 204/192.12 |
| 4,132,613 | 1/1979 | Penfold et al. | 204/192.12 |
| 4,486,287 | 12/1984 | Fournier | 204/192.12 |
| 4,572,776 * | 2/1986 | Aichert et al. | 204/298.19 |
| 4,595,482 * | 6/1986 | Mintz | 204/298.03 |
| 4,606,806 | 8/1986 | Helmer | 204/298.12 |
| 4,747,926 * | 5/1988 | Shimizu et al. | 204/298.18 |
| 4,810,347 * | 3/1989 | Smith | 204/298.18 |
| 5,122,252 * | 6/1992 | Latz et al. | 204/298.26 |
| 5,415,757 * | 5/1995 | Szcyrbowski et al. | 204/298.08 |
| 5,525,199 | 6/1996 | Scobey | 204/192.26 |
| 5,597,459 | 1/1997 | Altshuler | 204/192.12 |
| 6,066,242 * | 5/2000 | Glocker | 204/298.18 |

* cited by examiner

Primary Examiner—Rodney McDonald
(74) Attorney, Agent, or Firm—Harris Beach LLP (57) ABSTRACT

A hollow cathode magnetron for sputtering target material from the inner surface of a target onto an off-spaced substrate. The magnetron is in the shape of a truncated cone, also known as a conical frustum. The target cone is backed by a conical cathode maintained at a predetermined voltage for attracting gas ions into the inner surface of the target cone to sputter material therefrom. The inner surface of the cone is bounded at its inner and outer edges by magnetic pole pieces orthogonal to and extending inwardly and outwardly of the cone surface. The magnetic path is completed by a conical magnet surrounding the target and conical electrode and magnetically connected to the pole pieces to form a magnetic cage. Lines of magnetic flux extending above the target surface between the pole pieces are substantially parallel with the target surface, providing uniform erosion over the entire surface. Preferably, the conical magnet is tapered so that some lines of magnetic flux terminate in the target surface, maintaining thereby a uniform flux density and consequent uniform erosional intensity over all portions of the surface of the target. Sputter coatings on planar-targets can achieve a real thickness nonuniformities of less than +/−0.2%.

14 Claims, 10 Drawing Sheets

CONICAL SPUTTERING TARGET

The present application is a Continuation-In-Part of my application Ser. No. 09/095,301 filed Jun. 10, 1999 now U.S. Pat. No. 6,066,242.

DESCRIPTION

The present invention relates to apparatus for low-pressure deposition of materials, and more particularly to apparatus for sputter coating, and most particularly to a conical target and associated magnetron apparatus for making sputtered coatings having extremely high thickness uniformity.

Thickness uniformity requirements for sputtered coatings are becoming increasingly stringent. For example, the so-called L0 layer in digital video disks must have a reflectivity variation of less than +/−5% over the disk surface, requiring an equivalent uniformity in sputtered layer thickness. In some applications, only a minimum coated thickness or reflectivity is required, which may be readily achieved by coating to excess. However, this can shorten the useful lifetime of the sputtering target, and in the case of precious metals such as gold or silver such wasteful coating can be very expensive.

It is known in the art to move or rotate a substrate during coating to reduce a real variation in coated thickness, but newer generations of apparatus, such as cluster tools and optical disk coaters, typically coat a single substrate at a time without rotation. In some applications, the coating exposure time is less than one second. This means that the traditional method of moving the substrate relative to the source to produce more uniform coatings is either not possible or not practical.

Figure 1:
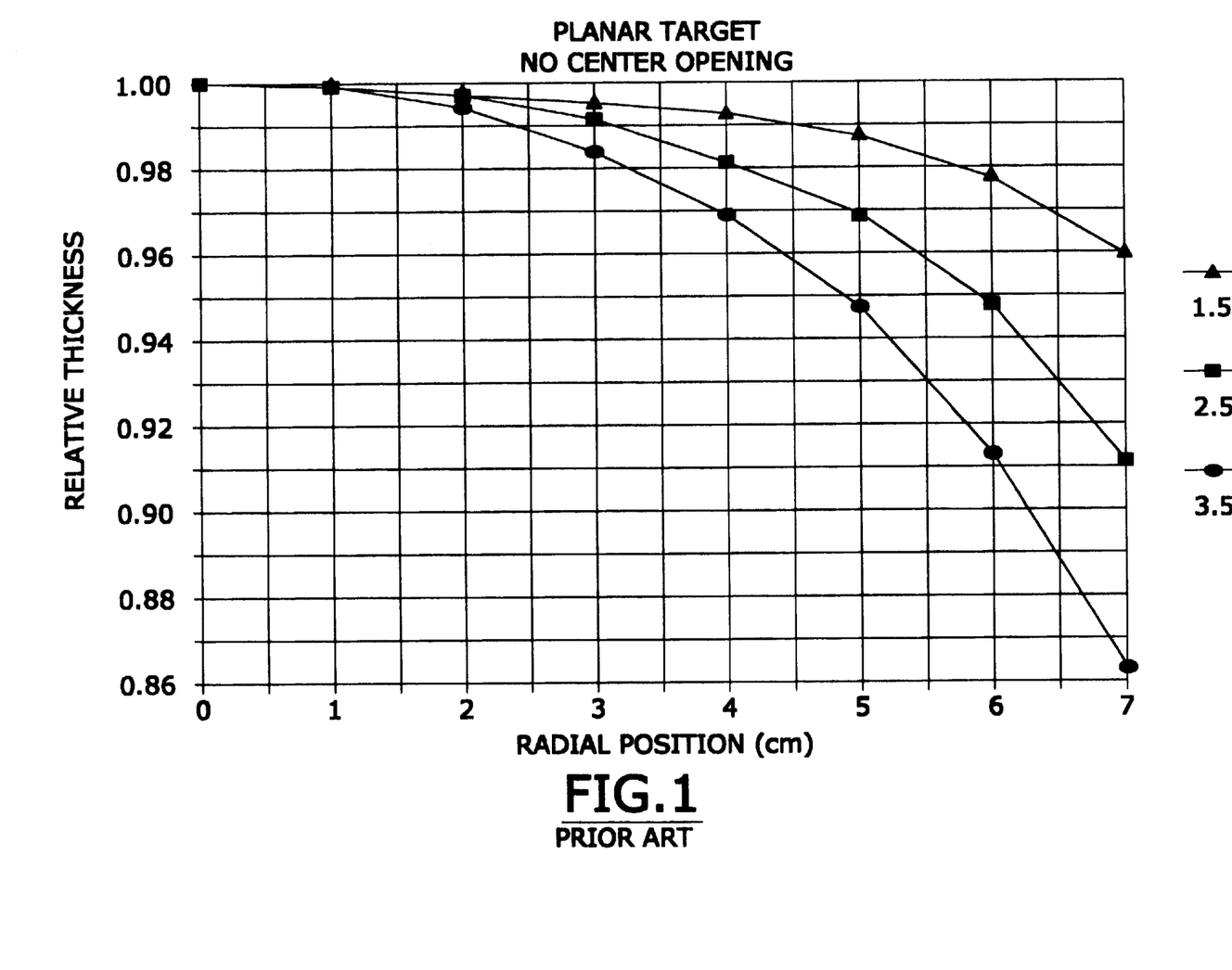
FIG. 1 is a calculated graph of sputtered deposition on a planar substrate from a prior art planar diode sputtering target having no center opening, showing relative thickness of deposition at various radial positions on the substrate, conducted at three different target-substrate spacings.

One way of achieving good uniformity when source and substrate are fixed with respect to each other is to use diode sputtering. This process removes material uniformly from a planar target and deposits it efficiently on a closely-spaced parallel substrate. FIG. 1 is a graph of calculations based on a uniform cosine distribution of material from each elemental area of a planar target 21 cm in diameter. This diameter was chosen to illustrate the possibility of good uniformity on a substrate 12 cm in diameter, such as a digital video disk. FIG. 1 shows that a thickness uniformity of approximately +/−1% can be achieved through diode sputtering.

Even though diode sputtering can result in good uniformity on circular substrates, it is almost never used because of several serious drawbacks. First, it produces relatively low sputtering rates at reasonable power densities, which translates into long coating times and low throughput. Second, diode sputtering requires high sputtering pressures, which results in less desirable film properties. Third, the diode sputtering process generates electrons which are accelerated away from the target at high energy which can damage or excessively heat the substrate being coated.

Magnetron sputtering overcomes these limitations such that virtually all modern sputtering is done with magnetron cathodes. These devices use magnetic fields to confine electrons to the vicinity of the target surface, resulting in more efficient use of electrons and higher plasma densities. This translates into lower operating pressures, less electron bombardment of the substrate, and higher deposition rates.

In a magnetron cathode, the erosion rate is highest where the magnetic field is parallel to the target surface. Therefore, in order to use as much of the target as possible and to maximize the uniformity of deposition as well, one useful design confines the electrons with a combination of a parallel magnetic field and electric field, known in the art as a hollow cathode configuration. An example of one such design is disclosed in U.S. Pat. No. 4,486,287.

Figure 2:
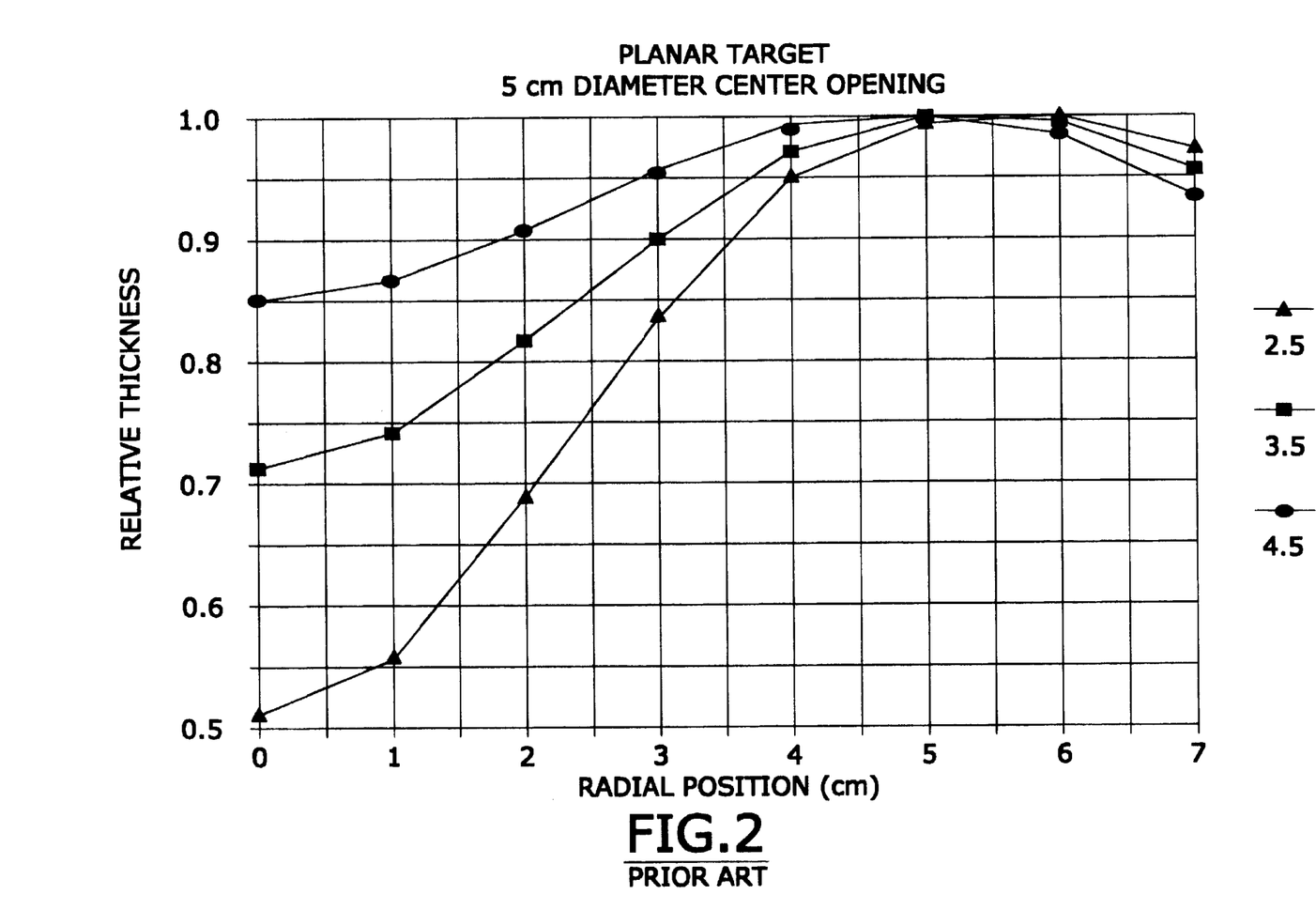
FIG. 2 is a calculated graph like that shown in FIG. 1, except that the prior art planar target is a magnetron and is provided with a center opening 5 cm in diameter.

A disadvantage of all planar magnetrons, in which the target is essentially a flat surface, is that the magnetic field lines must pass through the plane of the target in the inner portion of the target. This makes it impossible to magnetron sputter the surface of a planar target uniformly over its entire area, since there is always a central portion from which no sputtering takes place (whether or not target material is located there). The consequence of this on film uniformity is significant and is highly undesirable. FIG. 2 shows the effect of eliminating a central portion 5 cm in diameter of the previously described 21 cm target, such as is the case in a typical planar magnetron. Even though this central portion represents a relatively small percentage of the target area, the optimum uniformity on a 12 cm substrate is significantly reduced as a result of not using the central portion of the target. Moving farther away can improve uniformity but at a severe cost in materials utilization and deposition rate.

Figure 3:
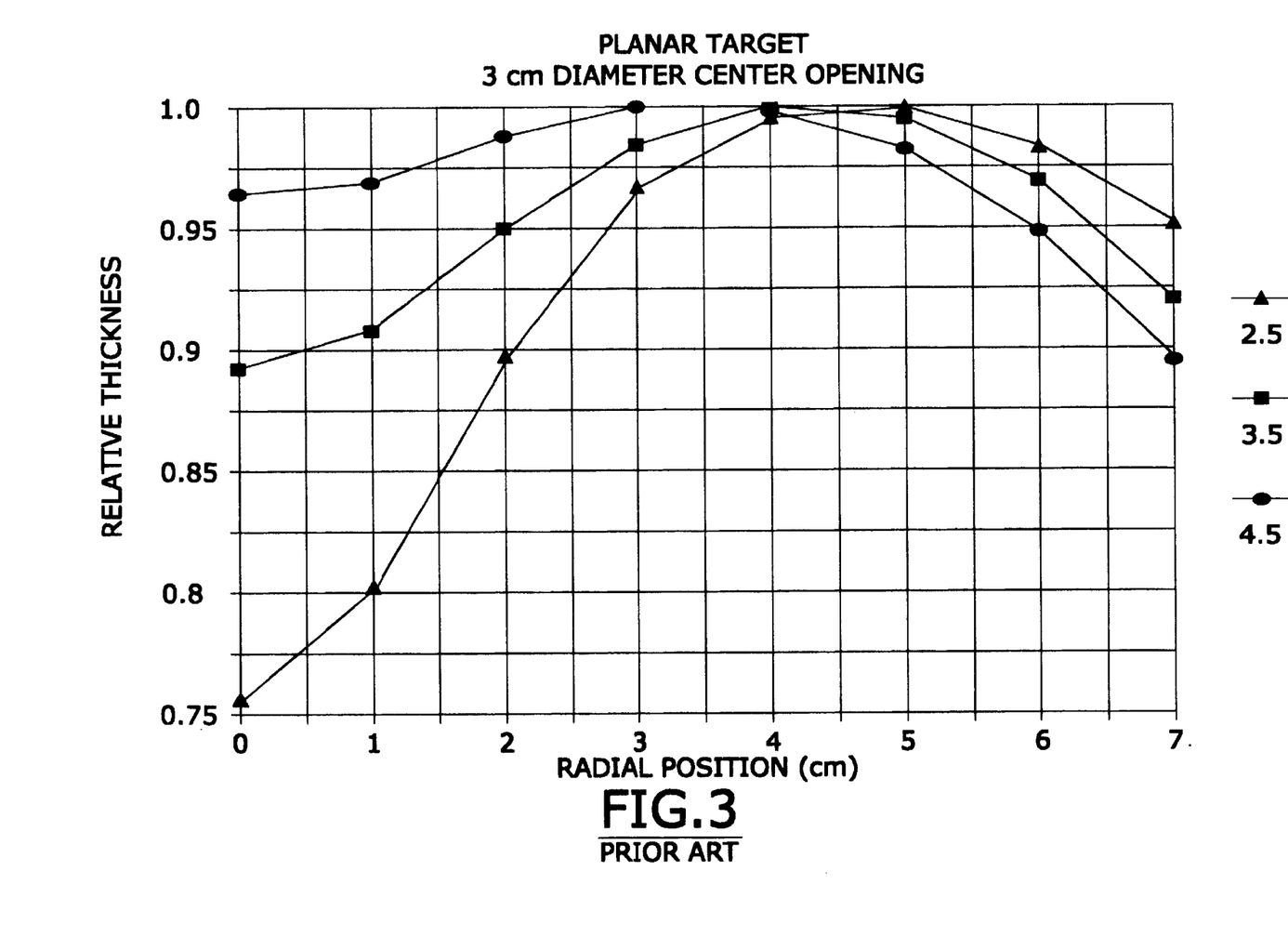
FIG. 3 is a calculated graph like that shown in FIG. 2, except that the prior art planar magnetron target is provided with a center opening 3 cm in diameter.

Minimizing the extent of this central portion is the subject of U.S. Pat. No. 5,597,459. In this configuration, the size of the magnetic pole piece is minimized to reduce the non-sputtered area. However, as shown in FIG. 3, even if the non-sputtering central area is reduced to a diameter of only 3 cm, there is still a significant penalty in terms of uniformity loss.

Achieving high uniformity over stationary substrates, therefore, presents a substantial problem for planar magnetrons. Several patents (see, for example, U.S. Pat. Nos. 4,595,482; 4,606,806; and 4,810,3470) disclose the simultaneous use of two independent concentric targets to achieve better uniformity than a single target alone can produce. However, such designs are relatively complex and sometimes require independent control of power to each target. Moreover, they do not use the hollow cathode concept, which means that the targets will not erode uniformly over their surfaces, resulting in relatively poor target utilization, as well as a distribution of sputtered material which changes of the a real uniformity over the lifetime of the target.

There is a class of magnetron sputtering cathodes which provide the advantages of essentially uniform material erosion over virtually the entire target surface and a stable coating profile over the entire target lifetime. These devices, known in the art as inverted cylindrical magnetrons, also use the hollow cathode confinement technique (see, for example, U.S. Pat. Nos. 3,884,793; 3,995,187; 4,030,996; 4,031,424; 4,041,353; 4,111,782; 4,116,793; 4,116,794; 4,132,612; and 4,132,613). However, instead of being a planar surface, the target typically is the inside surface of a cylinder. Such cathodes are available commercially for coating the outsides of wires, fibers, and three dimensional objects which are placed in or passed through the cylinder.

Figure 4:
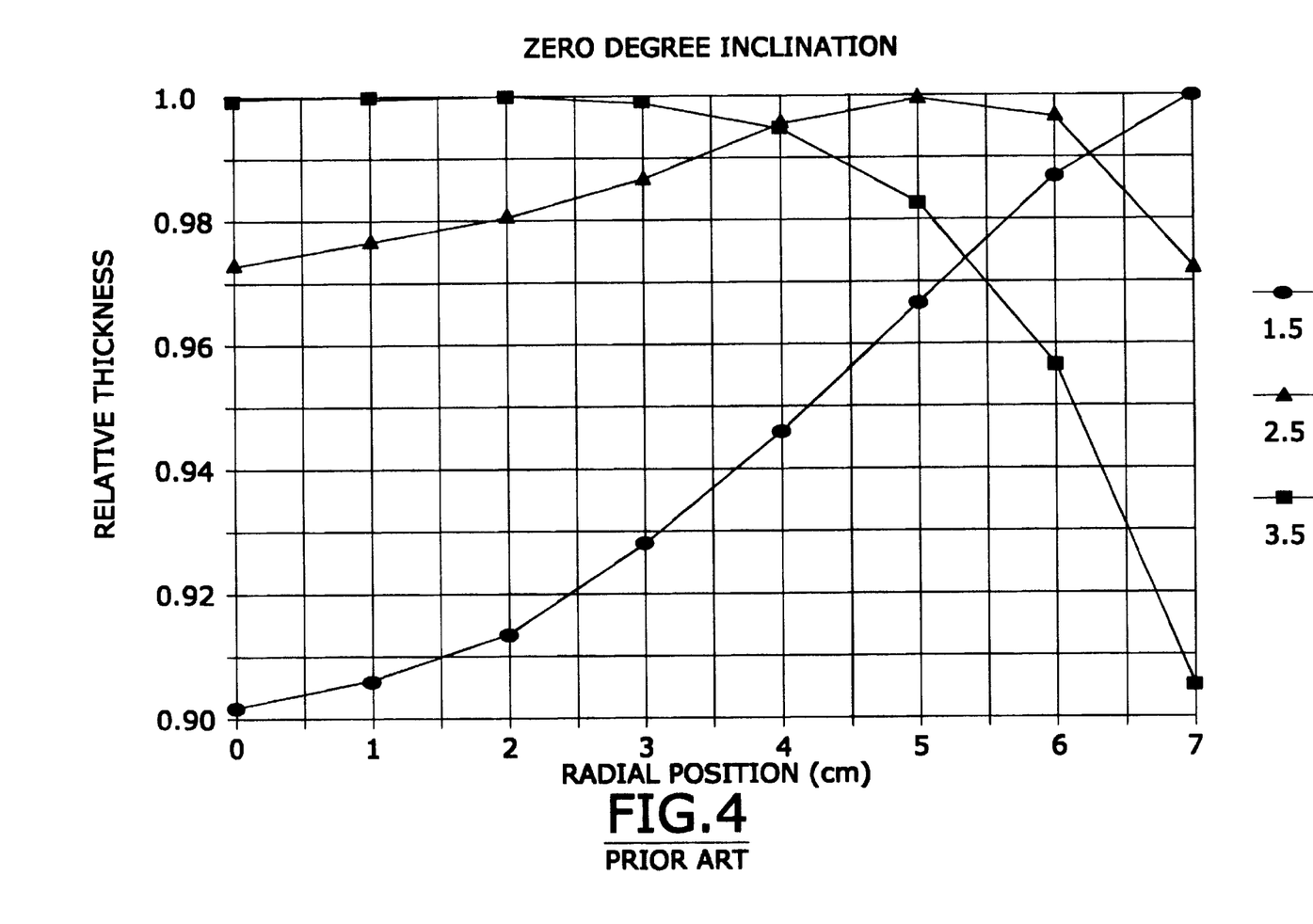
FIG. 4 is a calculated graph of sputtered deposition on a planar substrate orthogonal to the axis of a prior art cylindrical magnetron target (zero degree inclination angle of the substrate to the sputtering surface), conducted at three different spacings of the substrate from the end of the cylinder.

We have found, completely unexpectedly, that a flat, circular substrate placed with its surfaces normal to the axis of such a cylindrical magnetron and beyond the end of the cylinder can receive a relatively uniform coating (see the proceedings of the 39th Annual Technical Conference of the Society of Vacuum Coaters, 1996, p.97). For example, in FIG. 4 is shown a calculation of the coating profile produced by a cylindrical magnetron 10 cm long and 21 cm in diameter sputtering onto a flat substrate surface placed at three different distances from the end of the cylindrical target. Surprisingly, at a distance of 2.5 cm from the end, the uniformity variation is slightly better than +/−1%. However, a disadvantage of using cylindrical magnetron sputtering to coat a flat substrate is that, unless substrates are placed at both ends, substantially half of the sputtered material is lost out the unused end of the cylinder.

It is a principal object of the invention to provide an improved apparatus for making highly uniform sputtered coatings on planar substrates.

It is a further object of the invention to provide apparatus for making sputtered coatings on planar substrates with reduced waste of target material.

It is a still further object of the invention to provide an improved hollow cathode magnetron which sputters uniformly over its entire target surface.

Briefly described, a hollow cathode magnetron in accordance with the invention is provided in the shape of a truncated cone, also known as a conical frustum. The target cone is backed over its outer surface by a conical cathode maintained at a predetermined voltage for attracting gas ions into the inner surface of the target cone to sputter material therefrom. The inner surface of the cone is bounded at its inner and outer edges by magnetic pole pieces orthogonal to and extending inwardly and outwardly of the cone surface. The magnetic path is completed by one or more discrete magnets or a conical magnet surrounding the target and magnetically connected between the pole pieces. Lines of magnetic flux thus extend between the outer and inner pole pieces above and substantially parallel with the target surface, providing thereby erosion over the entire surface. Preferably, the conical magnet is tapered along its length so that some lines of magnetic flux terminate in the target surface, maintaining thereby a substantially uniform flux density over the surface and consequent uniform erosional intensity over all portions of the target. Sputter coatings on planar targets can achieve a real thickness nonuniformities of less than +/−0.2%.

The foregoing and other objects, features, and advantages of the invention, as well as presently preferred embodiments thereof, will become more apparent from a reading of the following description in connection with the accompanying drawings in which:

Referring to FIG. 1, a prior art circular planar diode sputtering target may be spaced apart from and parallel with a circular substrate 12 cm in diameter to be sputter coated. Such an arrangement is well known in the art and therefore the apparatus is not illustrated here. As shown in FIG. 1, at the closest practical spacing, 1.5 cm, deposition nonuniformity is about 2% (+/−1%) from center to edge (0 to 6 cm) of the substrate.

Referring to FIGS. 2–3, a prior art circular planar magnetron target having a center opening provides uniformity substantially inferior to that from the planar diode as shown in FIG. 1. Even at the farthest spacing examined, 4.5 cm, center-to-edge nonuniformity of +/−8% is obtained from a planar magnetron having a central aperture 5 cm in diameter. When the central aperture is reduced to 3 cm, nonuniformity is diminished but is still about +/−2.5% at the farthest spacing. FIG. 3 also shows that further uniformity improvement using a planar magnetron is not achievable through spacing changes: although coated uniformity of the inner portion of the substrate is improved with increased spacing between the target and substrate, coated thickness toward the outer edge of the substrate falls off rapidly with increasing radius.

Referring to FIG. 4, a hollow cylindrical magnetron, sputtering from its inner surface onto a substrate orthogonal to the cylindrical axis and beyond an end of the cylinder, can provide a coating having center-to-edge nonuniformity of about +/−1.5%. The coated profile is very sensitive to spacing of the substrate from the end of the cylinder and exhibits cross-over falloff similar to that seen with a planar magnetron in FIG. 3. Because the surface of the cylindrical target is orthogonal to the plane of the substrate, the surface is said to have "zero inclination angle" to the substrate, an important concept in a novel target discussed hereinbelow.

Figure 5:
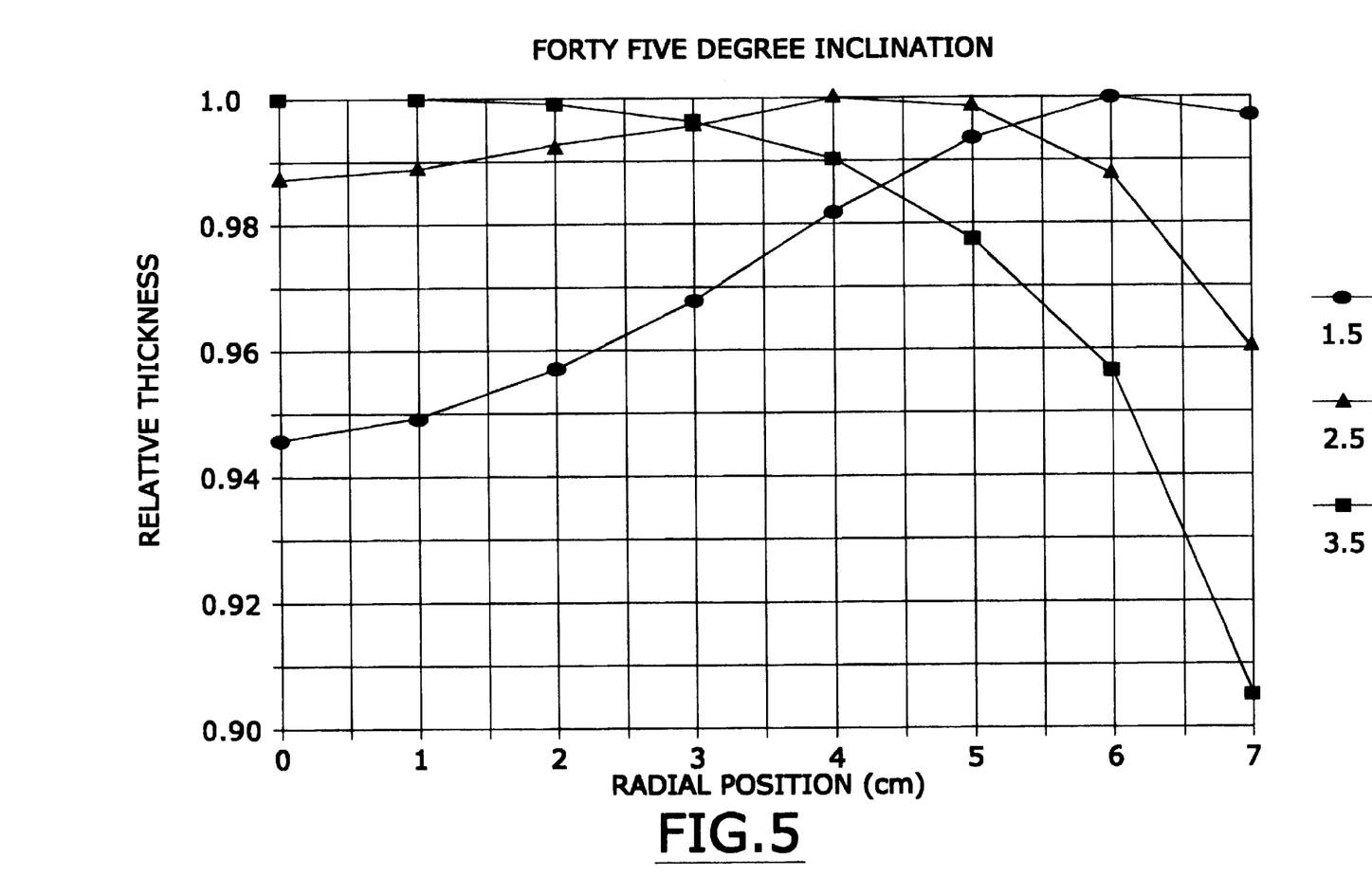
FIG. 5 is a calculated graph of a sputtered deposition on a planar substrate orthogonal to the axis of a frusto-conical magnetron target in accordance with the invention having a 90 degree included cone angle (45 degree inclination angle of the substrate to the sputtering surface), conducted at three different spacings from the large end of the cone.

As noted above, a disadvantage of using a cylindrical magnetron to sputter coat a flat substrate is that, unless substrates are placed at both ends, sputtered material is lost out the unused end. We reasoned that this loss could be minimized or even eliminated by narrowing the unused end of the cylinder, or in other words by forming the magnetron target as a truncated cone rather than a cylinder. Surprisingly, we found that the potential for coated uniformity is significantly better than that for a cylindrical target having similar dimensions. As shown in FIG. 5, by making the target surface a frustum cone with an included angle of 90 degrees, the coated uniformity of a substrate placed orthogonal to the cone axis and beyond the larger, or base end, of the cone, is even greater than can be achieved with the original planar diode target as shown in FIG. 1, the resulting non-uniformity capable of being substantially less than +/−1%. Also, unlike a planar magnetron, a frusto-conical shape makes possible the closing of magnetic flux lines through a relatively large diameter at the narrow end of the cone.

Figure 6:
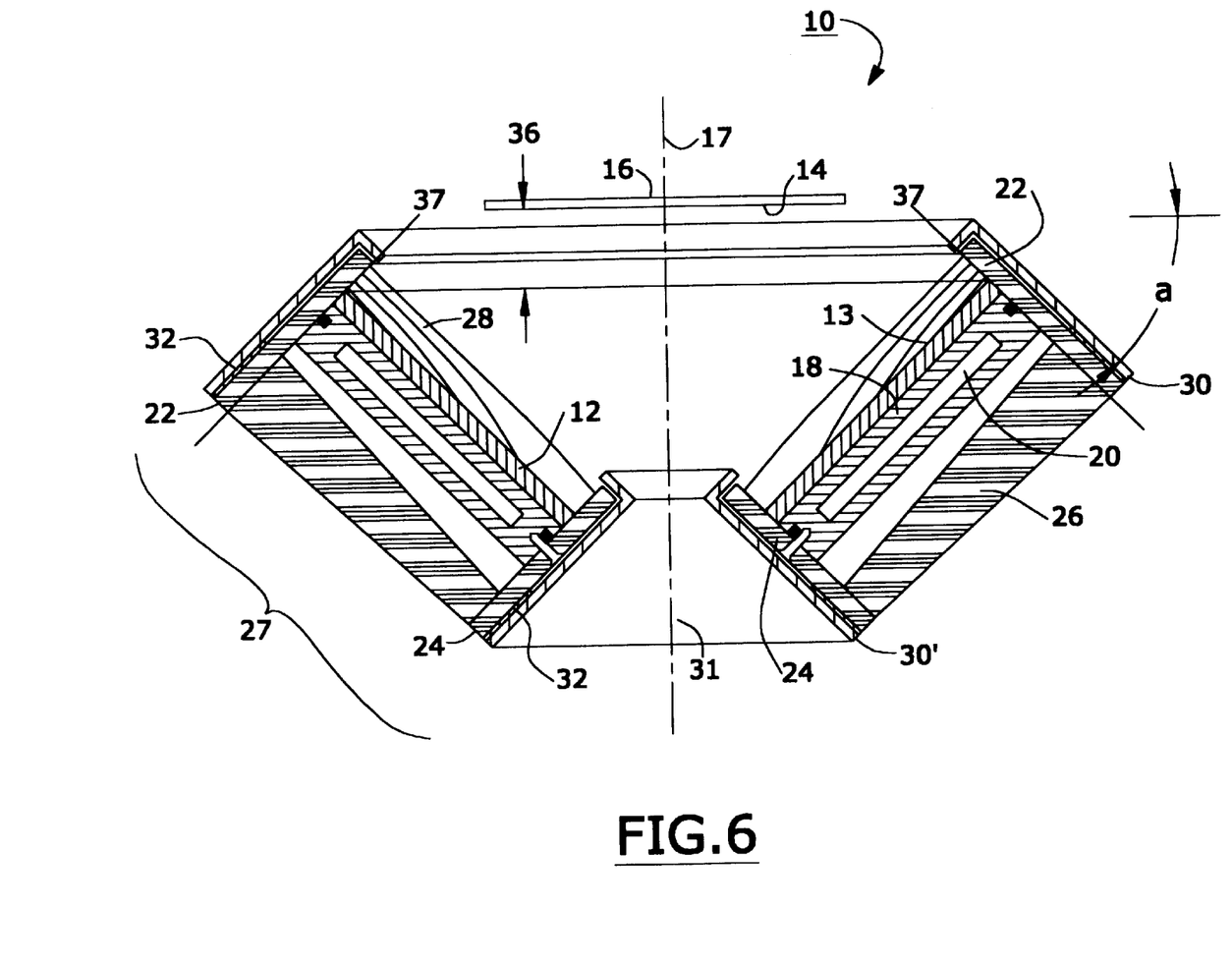
FIG. 6 is a cross-sectional view of a frusto-conical magnetron in accordance with the invention.

Referring to FIG. 6, a frusto-conical sputtering magnetron 10 in accordance with the invention has a conical target 12 formed of any material suitable for being sputter deposited on facing surface 14 of a substrate 16, for example but not limited to, metals such as aluminum, gold, and silver.

Typically, substrate 16 may be a disk having a radius R, the disk being disposed at a spacing 36 from target 12 and being coaxial with and orthogonal to axis 17 of target 12. Backing and supporting target 12 is a cooling jacket 18 having a coolant passageway 20 for circulation of a coolant liquid such as water. Jacket 18 also serves as an electrode, typically a cathode, for generation of an electric field and plasma for sputtering in a fashion well known to those skilled in the art and therefore not illustrated herein. Preferably, no bonding is provided between target 12 and jacket 18, since the target expands and thereby clamps tightly to the backing jacket due to temperature rise in the target which occurs during sputtering. Upper and lower wings 22,24 are reverse cones which are preferably substantially orthogonal to the inner surface of target 12 and which capture target 12 and jacket 18 therebetween. Wings 22,24 extend both inward and outward of target 12 and are physically connected outboard of jacket 18 by one or more magnets 26 to form a magnetic cage 27 similar to that disclosed in U.S. Pat. No. 3,919,678, hereby incorporated by reference, for use in cylindrical magnetrons. Magnet 26 may be a continuous conical magnet or a conical cage formed of a plurality of individual magnets. Preferably, magnet 26 is a permanent magnet, although electromagnets are within the scope of the invention.

Plasma confinement near the sputtering surface 13 of target 12 is achieved by a combination of wings 22,24 which are maintained at the target potential and a magnetic field 28 whose component parallel to the target surface is essentially uniform. Outer anode 30 and inner anode 30' are electrically isolated from cathode 18 and target 12 by insulation 32 which also acts as a vacuum seal between the interior of the magnetron during sputtering and its exterior. Inner anode 30 may be formed with or without an axial opening 31. It is a characteristic of magnetron 10 that all lines of magnetic flux lie in planes which include the axis of the target cone, and therefore no lines of flux cross from one plane to another (have no azimuthal component). The flux lines thus converge toward the narrow end of target 12. In order to erode all areas of the target surface at a uniform rate, it is necessary to maintain the magnetic field at uniform field strength parallel to the target surface. This can be achieved by using a conical magnet 26 which tapers in strength from its outer end to inner end, either through physical tapering of magnet thickness as shown in FIG. 6 or through a magnet whose magnetization per unit volume is varied along its length. This arrangement causes some lines of magnetic flux 34 to enter surface 13 without reaching lower wing 24, thus reducing the magnetic flux density over the shorter-radius portions of the target surface. This is necessary because the lines of flux converge toward the apex of the cone, and otherwise the flux density would progressively increase along the length of the frustum. Another means for attenuating the magnetic intensity along the target surface is to provide magnet 26 as a conical magnet which is magnetized parallel to the surface of the cone. Other methods may be obvious for producing a magnetic field that is essentially uniform in strength parallel to the target surface and has no azimuthal component, and such methods are within the scope of the invention.

Figure 7:
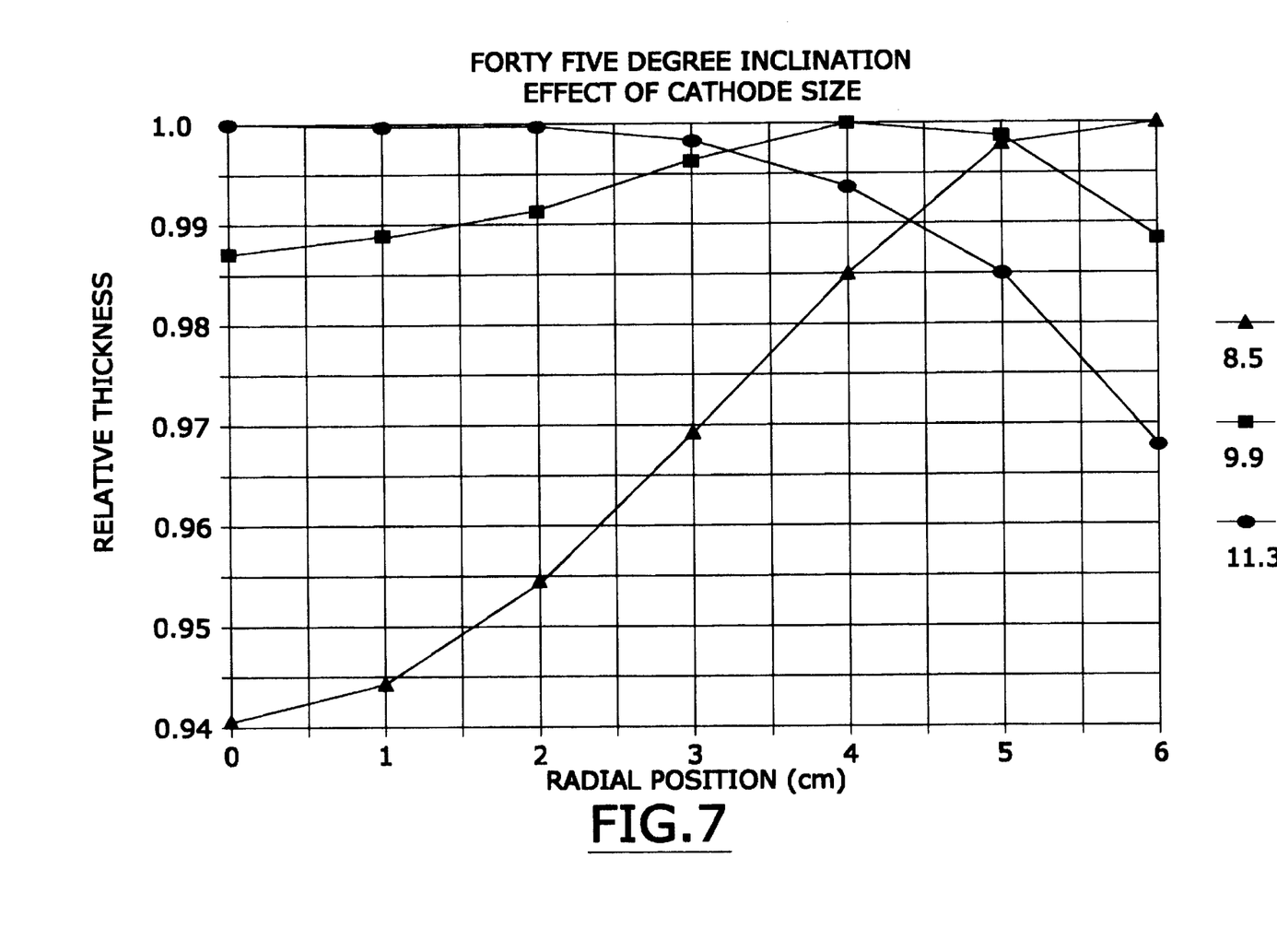
FIG. 7 is a calculated graph showing the effect of changing the frustum length of the conical target in FIG. 6.

Effective use of a conical magnetron in accordance with the invention requires the mutual optimization of included cone angle, target length, and substrate spacing from the target, along with a combination of magnetic and electrostatic electron confinement that results in effectively uniform target erosion. Referring to FIG. 7, the result of changing frustum length and maximum cone diameter at an included cone angle of 90 degrees (inclination angle A of 45 degrees) is shown. Under these conditions, a spacing (36 on FIG. 6) of about 9.9 cm is optimum and can provide a coated thickness uniformity variation of about +/-0.7%. In general, the most effective maximum target radius, that is, the radius of the base of the cone, is between about 1.5 and 2.0 times the radius R of the substrate. The most effective length of the frustum of the cone between the ends thereof is between about 0.5R and about 1.5R. Combining these two parameters, it is found that the highest depositional uniformity is produced when the frustum length (shortest distance between the large and small openings along the surface of the cone) is about one half the diameter of the large opening. Since uniformity is also a function of substrate spacing, optimization of uniformity is readily achieved empirically by first providing a target having these proportions and then varying spacing.

Figure 8:
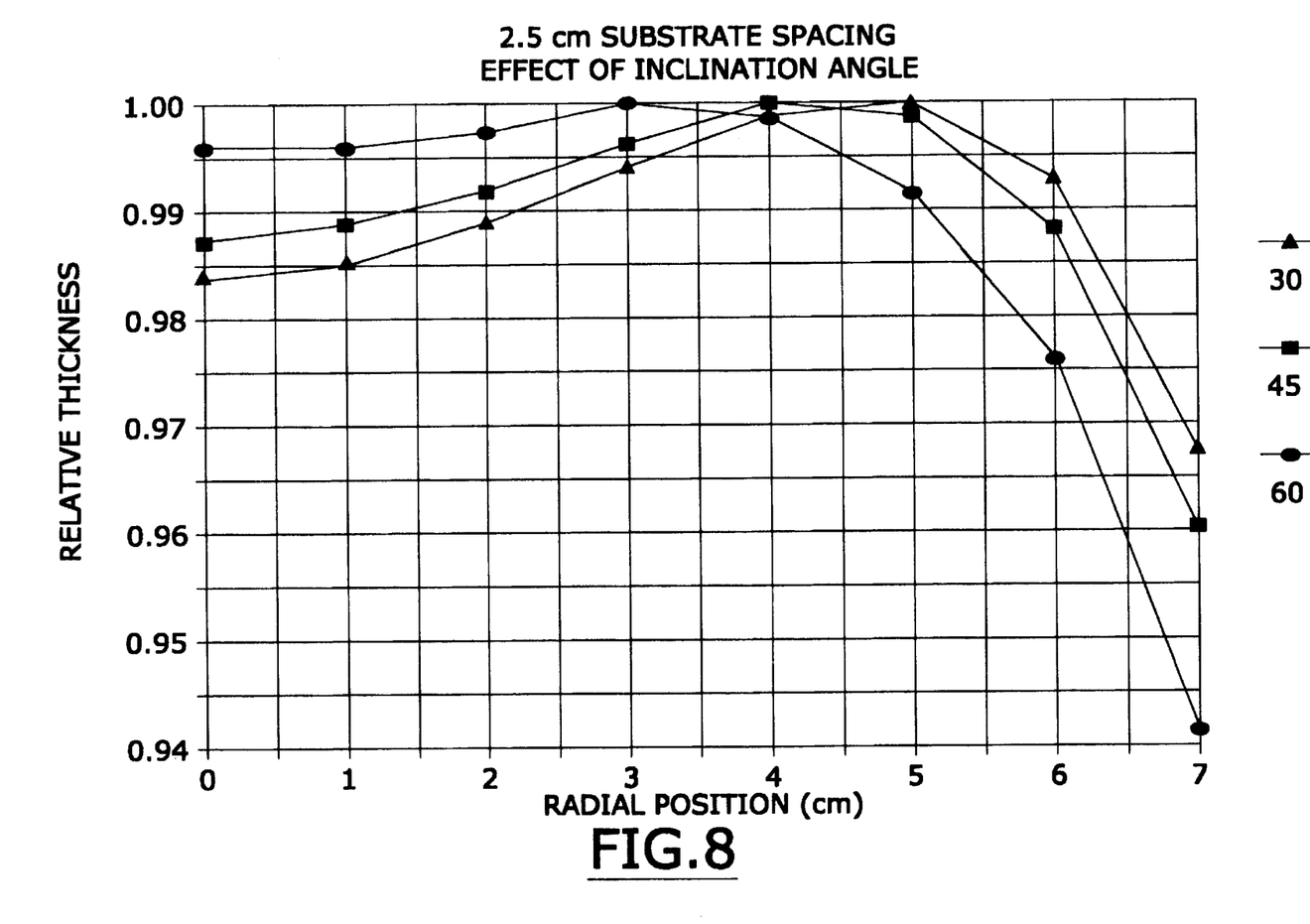
FIG. 8 is a calculated graph showing the effect of changing the included angle of the frusto-conical target in FIG. 6.

Referring to FIG. 8, the system is surprisingly insensitive to large variations in included cone angle. For a substrate 6 cm in radius, such as a digital video disk, a 90 degree cone angle is probably optimum (same data as shown in FIG. 7), although for smaller substrates such as an 8 cm disk (4 cm radius) a 60 degree included cone angle (60 degree inclination angle) can provide a coated thickness uniformity variation of less than about +/-0.2%. In general, a usable included cone angle should be between about 60 degrees and about 120 degrees.

Figure 9:
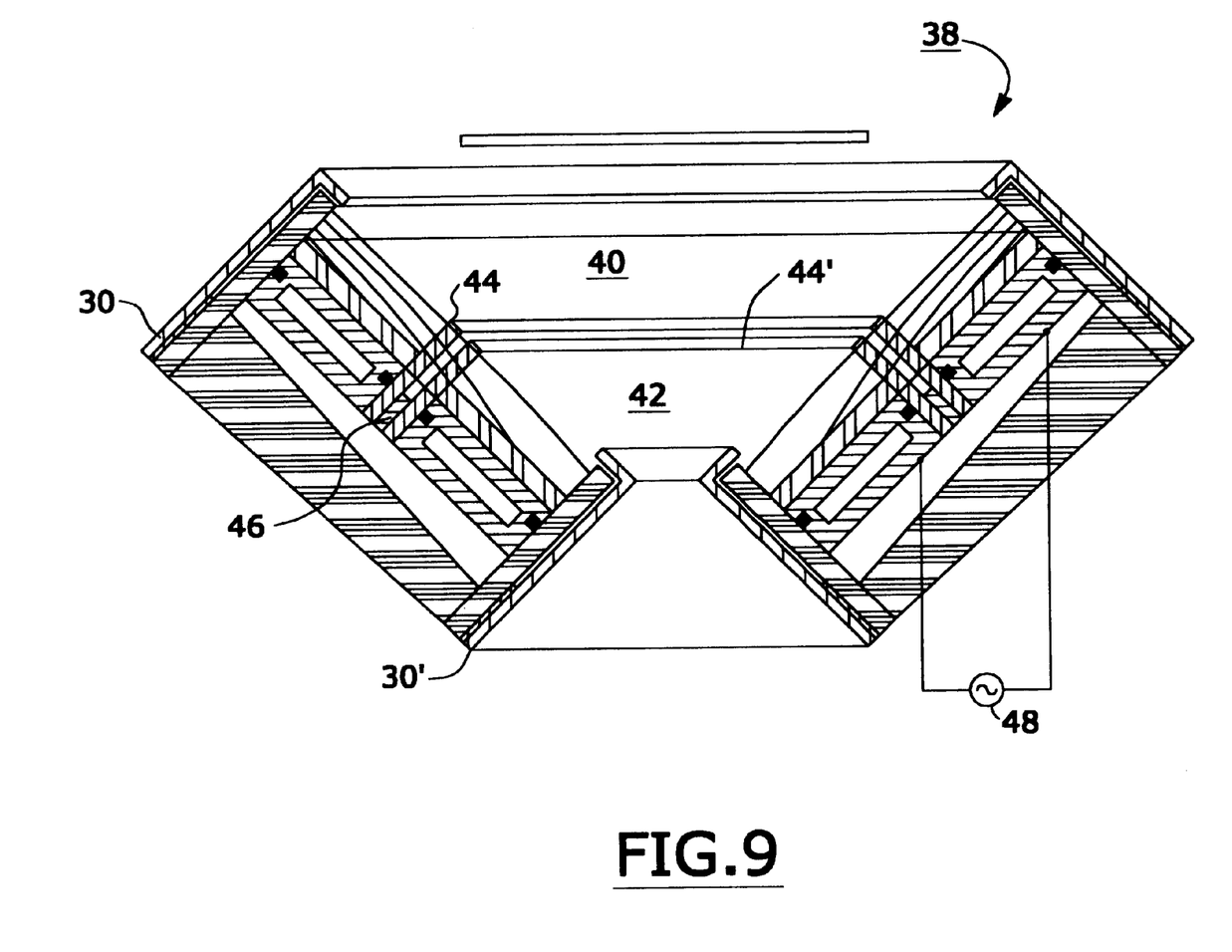
FIG. 9 is a cross-sectional view of a frusto-conical magnetron having a split target suitable for RF-powered sputtering.

A conical magnetron 38 in accordance with the invention can be configured for RF sputtering, as shown in FIG. 9. Conical target 12 is provided as an inner conical cathode 40 and an outer conical cathode 42, separated by additional wings 44,44' which are themselves separated by an electrical insulator 46. The two cathodes are connected across a conventional RF power source 48.

Figure 10:
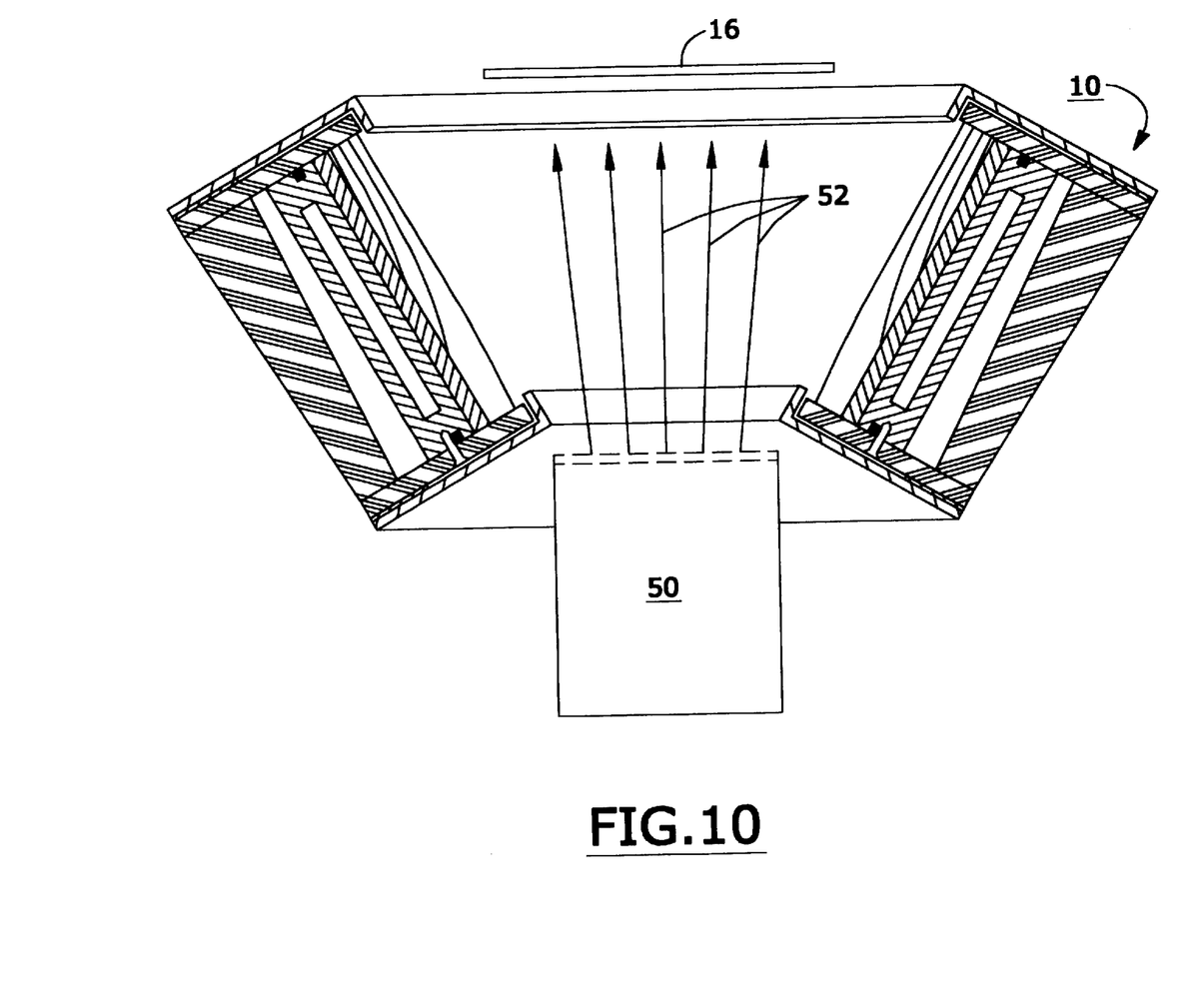
FIG. 10 is a cross-sectional view of a frusto-conical magnetron combined with an ion beam deposition source.

Another advantage of a frusto-conical magnetron is that the opening at the narrow end can permit use of other equipment simultaneously during sputtering, as shown in FIG. 10. For example, a Kaufman type ion source 50 may be mounted in such a way that it can bombard the growing film on the substrate surface with ions 52 of controlled type, energy, and dose. This can be very useful in controlling film properties. The opening also permits the deposition of insulating compounds formed by rapidly sputtering a metal target and simultaneously bombarding the growing film with a reactive gas. In some applications it may be necessary to alter the included cone angle to accommodate the additional apparatus, for example, in FIG. 10 the included cone angle is 60 degrees, which is within the range of cone angles capable of providing excellent depositional uniformity.

A further advantage of a frusto-conical magnetron is that the components may readily be held together by atmospheric pressure. With suitable backing (not shown) of the magnetic cage, a chamber seal at point 37 in FIG. 6 can lock the components together while the interior of the magnetron is under vacuum and also can permit rapid removal and replacement of a used target when the vacuum is broken simply by first removal of anode 30 and wing 22. In known magnetrons, target replacement can be a time-consuming, and therefore costly, operation.

From the foregoing description it will be apparent that there has been provided an improved magnetron for sputter coating of planar substrates, wherein a substantially uniform magnetic field is maintained over all portions of the surface of a frusto-conical target. Variations and modifications of the herein described magnetron, in accordance with the invention, will undoubtedly suggest themselves to those skilled in this art. Accordingly, the foregoing description should be taken as illustrative and not in a limiting sense.

What is claimed is:

1. A magnetron for sputtering a target material onto a substrate having a radius R to form a coating of the target material upon a surface of the substrate, comprising:
   a) a frusto-conical target off-spaced from said substrate and having an inner surface for being sputtered, said conical target being a conical frustum having an axis centrally disposed through first and second parallel planes truncating said conical target to define respectively larger and smaller openings in said target, said target having a frustum length determinable along said inner surface between said openings and having an included cone angle defined by the angle between the locus of opposite sides of said surface included in a plane inclusive of said axis;
   b) a cathode disposed adjacent said frusto-conical target opposite said inner surface;
   c) magnetic means cooperative with said frusto-conical target and said cathode for providing a magnetic field between said inner surface and said substrate surface, said magnetic field comprising flux lines extending over said inner surface, each of said flux lines being contained in a planes containing said axis, and the component of said magnetic field parallel to said inner surface being the same strength at all points on said inner surface; and
   d) an anode disposed adjacent said magnetic means for cooperating with said cathode and said magnetic means to provide an electric plasma over said inner surface.

2. A magnetron in accordance with claim 1 wherein said magnetic means includes a fixed magnet and first and second pole pieces.

3. A magnetron in accordance with claim 2 further comprising means for confining said plasma over said inner surface.

4. A magnetron in accordance with claim 3 wherein said means for confining includes means for imposing a voltage differential between said inner surface and said first and second pole pieces such that said inner surface is a cathode and said pole pieces are anodes, and means for electrostatic confinement of said plasma at the ends of said frusto-conical target.

5. A magnetron in accordance with claim 2 wherein said first and second pole pieces are disposed orthogonal to and extend inwardly of said target surface.

6. A magnetron in accordance with claim 5 wherein said cathode is in electrical contact with said magnetic means such that at least one of said first and second inwardly-extending magnetic pole pieces is also an inwardly-extending wing of said cathode.

7. A magnetron in accordance with claim 5 wherein at least one of said inwardly-extending magnetic pole pieces is electrically isolated from said cathode, and wherein said cathode has at least one inwardly-extending wing.

8. A magnetron in accordance with claim 1 wherein said inner surface of said frusto-conical target has a maximum radius of between about 1.5R and about 2.0R.

9. A magnetron in accordance with claim 1 wherein the length of the sputtering area along the frustum of said frusto-conical target is between about 0.5R and about 1.5R.

10. A magnetron in accordance with claim 1 wherein said substrate is disposed orthogonally to said axis of said frusto-conical target at a distance of between about 0.1R and about 0.4R from the base of said frusto-conical target.

11. A magnetron in accordance with claim 1 wherein the included cone angle of said frusto-conical target is between about 60 degrees and about 120 degrees.

12. A magnetron in accordance with claim 1 wherein said frusto-conical target and said cathode are retainable within said magnetic means by atmospheric pressure outside said means.

13. A magnetron in accordance with claim 1 further comprising an ion beam source disposed for projection of said ion beam through said smaller opening in said target.

14. A magnetron for radio frequency sputtering a target material onto a substrate to form a coating of the target material upon a surface of the substrate, comprising:
   a) first and second hollow frusto-conical targets off-spaced from said substrate, each of said targets having an axis and an inner surface for being sputtered;
   b) first and second cathodes disposed adjacent said frusto-conical targets opposite said first and second inner surfaces, respectively;
   c) magnetic means receivable of said frusto-conical targets and said first and second cathodes for providing a magnetic field between said inner surfaces and said substrate surface, said magnetic means extending inwardly of said inner surfaces toward said substrate surface;
   d) an anode disposed adjacent said magnetic cage; and
   e) a radio frequency power source connected across said cathodes and said anode to produce an electric plasma over said inner surfaces.

* * * * *